(12) United States Patent
Maeda et al.

(10) Patent No.: US 7,170,000 B2
(45) Date of Patent: Jan. 30, 2007

(54) APPARATUS HAVING A COOLING DEVICE

(75) Inventors: Kazuhiko Maeda, Yokohama (JP); Hiroaki Agata, Yokohama (JP)

(73) Assignee: Lenovo Singapore Pte, Ltd., Singapore (SG)

( * ) Notice: Subject to any disclaimer, the term of this patent is extended or adjusted under 35 U.S.C. 154(b) by 655 days.

(21) Appl. No.: 10/387,724

(22) Filed: Mar. 13, 2003

(65) Prior Publication Data
US 2003/0183269 A1 Oct. 2, 2003

(30) Foreign Application Priority Data
Mar. 13, 2002 (JP) .............................. 2002-069129

(51) Int. Cl.
*H01L 35/00* (2006.01)
(52) U.S. Cl. ...................... 136/203; 136/218
(58) Field of Classification Search ................ 136/203, 136/218
See application file for complete search history.

(56) References Cited
U.S. PATENT DOCUMENTS
5,837,929 A * 11/1998 Adelman ................... 136/225
6,236,810 B1 * 5/2001 Kadotani ................... 392/485
6,614,109 B2 * 9/2003 Cordes et al. .............. 257/712

* cited by examiner

*Primary Examiner*—Nam Nguyen
*Assistant Examiner*—Anthony Fick
(74) *Attorney, Agent, or Firm*—Kunzler & Associates; Carlos Munoz-Bustamante

(57) ABSTRACT

Apparatus having a cooling device capable of both power generation using heat from a heat-generating component and cooling of the heat-generating component is provided. The cooling device has a heat-receiving part which receives heat conducted from a CPU, which is an external heat-generating component, a thermoelectric conversion part arranged to absorb heat from the heat-receiving part and having operating modes including a mode of cooling the heat-receiving part by being supplied with a current and a power generation mode of converting heat received from the heat-receiving part into a current and outputting the current, and a selecting part which makes a selection according to a temperature condition of the CPU as to in which one of the modes the thermoelectric conversion part should be operated.

20 Claims, 12 Drawing Sheets

APPARATUS HAVING A COOLING DEVICE

BACKGROUND OF THE INVENTION

The present invention relates to a cooling device and, more particularly, to a cooling device with reduced power consumption and improved efficiency.

In recent years, the development of energy-saving types of electric apparatuses, transport or mobile apparatuses, etc., considered necessary from the viewpoint of environmental and energy problems, has been advanced. In information processing apparatuses including computers such as personal computers (PCs) and servers, external storage units, and communication apparatuses, power consumption tends to increase with the increase in operating frequency and in performance of integrated circuits (ICs) such as central processing units (CPUs) and logic ICs. Therefore techniques for realizing information processing apparatuses with reduced power consumption are being developed.

For example, Published Unexamined Patent Application No. 2001-282396 discloses a technique for generating power by thermoelectric conversion of heat generated from a heating-generating component of an electronic apparatus comprising a computer. According to the technique disclosed in Published Unexamined Patent Application No. 2001-282396, generated power is used to drive each of blocks in the electronic apparatus, for example.

Many of various kinds of apparatuses, such as electric apparatuses including information processors, and transport or mobile apparatuses, generate heat in the process of operating electrically or mechanically. In the art disclosed in Published Unexamined Patent Application No. 2001-282396, this heat is utilized to generate power. On the other hand, in apparatuses in which heat is generated, there is required a need to perform thermal processing for cooling the heat-generating component. Therefore, it is desirable to achieve both power generation and cooling with efficiency.

SUMMARY OF THE INVENTION

It is a purpose of the present invention to provide a cooling device capable of solving the above-described problem. This can be achieved by a combination of features described in the independent claims, in the appended claims, and more advantageous examples of the present invention are specified in the dependent claims.

According to a first aspect of the present invention, there is provided a cooling device and an electric apparatus using the cooling device, the cooling device having a heat-receiving part which receives heat conducted from an external heat-generating member, a thermoelectric conversion part arranged to absorb heat from the heat-receiving part and having operating modes including a cooling mode of cooling the heat-receiving part by being supplied with an electrical current, hereinafter a current, and a power generation mode of converting heat received from the heat-receiving part into a current and outputting the current, and a selecting part which makes a selection on the basis of a temperature condition of the heat-generating member as to in which one of the operating modes the thermoelectric conversion part should be operated.

According to a second aspect of the present invention, there is provided a cooling device and an electric apparatus using the cooling device, the cooling device having a first heat-receiving part and a second heat-receiving part each receiving heat conducted from the outside, a first thermoelectric conversion part arranged to absorb heat from the first heat-receiving part and having operating modes including a cooling mode of cooling the first heat-receiving part by being supplied with a current, and a power generation mode of converting heat received from the first heat-receiving part into a current and outputting the current, and a second thermoelectric conversion part arranged to absorb heat from the second heat-receiving part and having operating modes including a cooling mode of cooling the second heat-receiving part by being supplied with a current, and a power generation mode of converting heat received from the second heat-receiving part into a current and outputting the current, wherein in a case where the first thermoelectric conversion part operates in the power generating mode while the second thermoelectric conversion part operates in the cooling mode, the second thermoelectric conversion part uses the current output from the first thermoelectric conversion part to cool the second heat-receiving part.

According to a third aspect of the present invention, there is provided a cooling method of cooling a heat-generating part which generates heat, said method including a step of receiving through a heat-receiving part heat conducted from the heat-generating part, a step of selecting, on the basis of a temperature condition of the heat-generating part, the operating mode of a thermoelectric conversion part arranged to absorb heat from the heat-receiving part, the operating mode including a cooling mode of cooling the heat-receiving part by being supplied with a current, and a power generation mode of converting heat received from the heat-receiving part into a current and outputting the current.

According to a fourth aspect of the present invention, there is provided a cooling method of cooling a first heat-generating part and a second heat-generating part each generating heat, the method including a step of receiving through a first heat-receiving part heat conducted from the first heat-generating part, and a step of receiving through a second heat-receiving part heat conducted from the second heat-generating part, wherein in a case where a first thermoelectric conversion part arranged to absorb heat from the first heat-receiving part and having operating modes including a cooling mode of cooling the first heat-receiving part by being supplied with a current and a power generation mode of converting heat received from the first heat-receiving part into a current and outputting the current operates in the power generation mode while a second thermoelectric conversion part arranged to absorb heat from the second heat-receiving part and having operating modes including a cooling mode of cooling the second heat-receiving part by being supplied with a current and a power generation mode of converting heat received from the second heat-receiving part into a current and outputting the current operates in the cooling mode, a current output from the first thermoelectric conversion part is input to the second thermoelectric conversion part to cool the second heat-receiving part.

The summary of the present invention is not a list of all necessary features of the present invention, and the present invention also includes subcombinations of described features.

BRIEF DESCRIPTION of the DRAWINGS

Some of the purposes of the invention having been stated, others will appear as the description proceeds, when taken in connection with the accompanying drawings, in which.

DETAILED DESCRIPTION OF THE ILLUSTRATIVE EMBODIMENTS

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
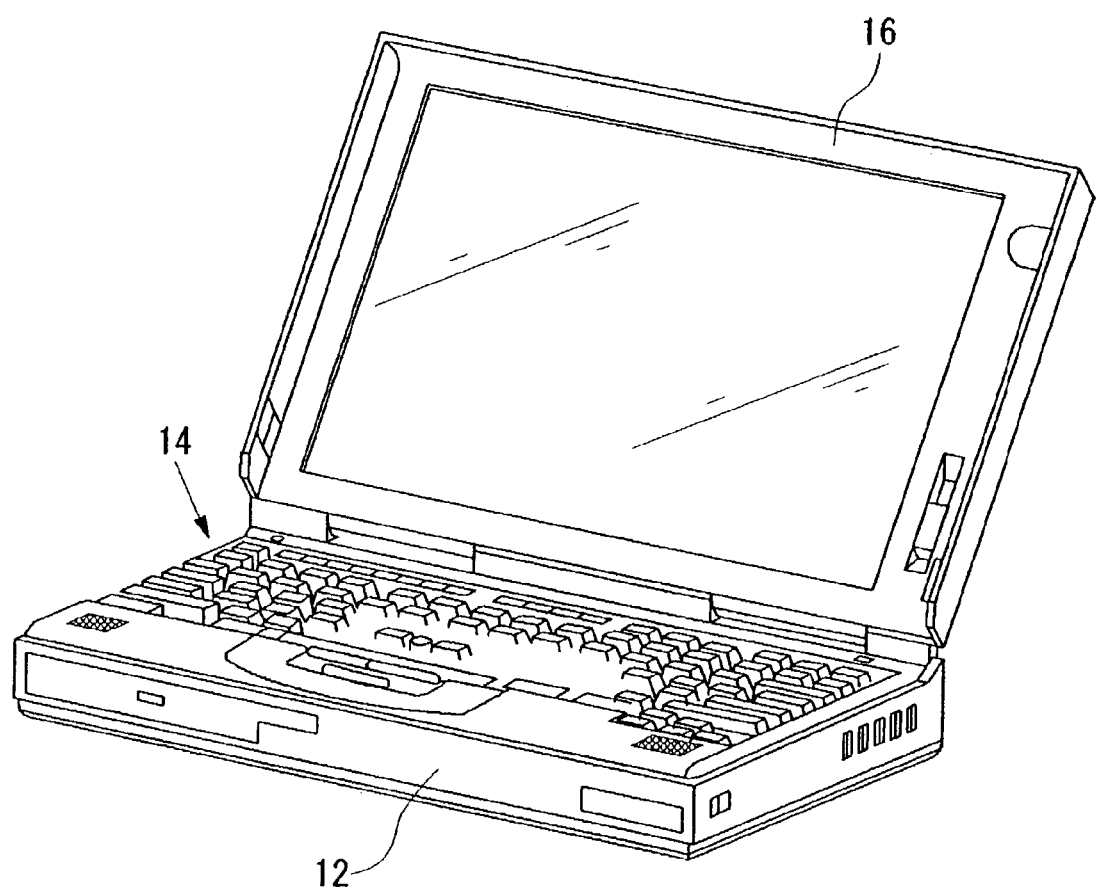
FIG. 1 is a diagram showing an external appearance of an information processor 10 according to an embodiment of the present invention.

Referring now more particularly to the accompanying drawings, FIG. 1 shows the appearance of an information processor 10 representing an embodiment of the present invention. The information processor 10 representing the embodiment is an example of an electric apparatus in accordance with the present invention. The information processor 10 has an information processor main unit 12 and a display unit 16.

The information processor main unit 12 executes programs such as an application program and an operation system to perform information processing designated by a user for example. The information processor main unit 12 has electronic components operating electronically, e.g., an integrated circuit, and mechanical components operating mechanically, e.g., a hard disk drive. These components are operated by using a battery or an external power supply. The information processor main unit 12 also has a keyboard unit 14 which is used by a user to input a command or the like and data to the information processor main unit 12.

The display unit 16 displays to a user of the information processor 10 images produced by an application program and the operating system.

Figure 2:
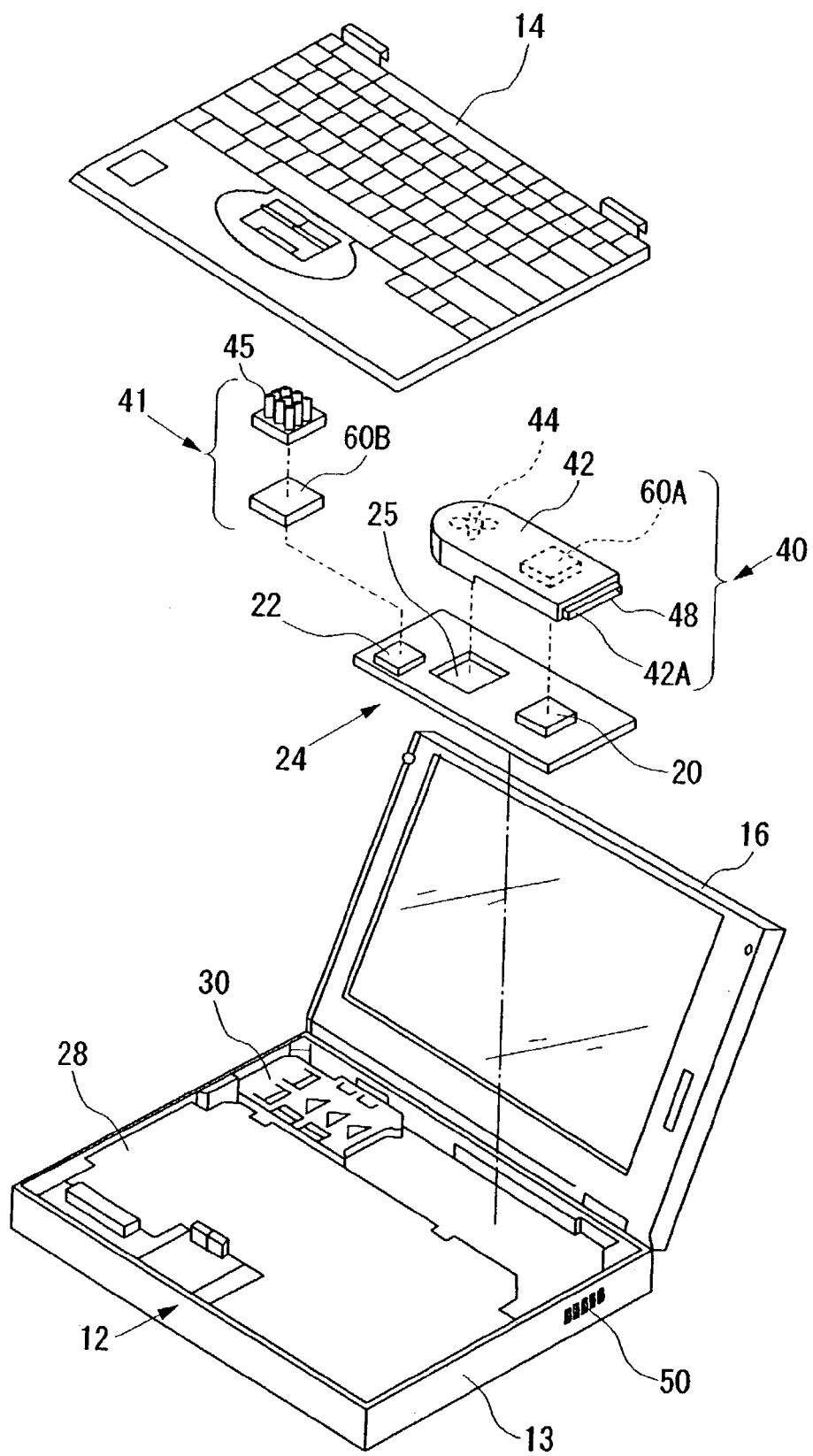
FIG. 2 is a diagram showing the internal structure of an information processor main unit 12 according to the embodiment of the present invention.

FIG. 2 shows the internal structure of the information processor main unit 12 representing the embodiment of the present invention. The information processor main unit 12 has as its internal components a motherboard 28, a hard disk drive 30, a CPU card 24, a cooling unit 40, and a cooling unit 41.

The motherboard 28 is a board on which memories such as a read-only memory (ROM) and a random-access memory (RAM), integrated circuits for controlling internal components of the information processor 10, etc., are mounted. The hard disk drive 30 stores programs and data used by the information processor 10.

On the CPU card 24, a CPU 20, a host controller 22, etc., are mounted. These components are connected to the mother board 28. The CPU 20 is an integrated circuit which performs, for example, information processing and control of each component of the information processor 10 by operating on the basis of a program which is, for example, stored in one of the memories. The host controller 22 is an integrated circuit which transfers programs and data between the CPU 20, the memories and other various input/output devices. Each of the CPU 20 and the host controller 22 operates by using power from a battery mounted on the information processor 10 or from an external power supply, and generates heat while operating. Each of the CPU 20 and the host controller 22 is an example of a heat-generating member or a heat-generating part in accordance with the present invention.

The cooling unit 40 generates power by utilizing heat generated by the CPU 20. The cooling unit 40 includes a thermoelectric conversion module 60A, a heat sink 42, and a fan 44.

The thermoelectric conversion module 60A is a module for cooling the CPU 20 and/or generating power by utilizing heat generated by the CPU 20. The thermoelectric conversion module 60A of this embodiment is bonded to a bottom portion of the heat sink 42 in such a position that a bottom surface 60A of the heat sink 42 is interposed between the thermoelectric conversion module 60A and the CPU 20. The thermoelectric conversion module 60A receives heat from the CPU 20. The thermoelectric conversion module 60A of this embodiment has operating modes including a cooling mode of cooling its lower surface by using a current externally supplied, and a power generation mode of converting heat received from its lower surface into a current and outputting this current.

The heat sink 42 is made of, for example, aluminum and forms an air passage for passage for air for cooling the upper surface of the thermoelectric conversion module 60A. The fan 44 is a placed in the air passage formed in the heat sink 42, and draws air from the outside into the heat sink 42 through an air inlet 25 provided with the CPU card 24. Air drawn in by the fan 44 cools the upper surface of the thermoelectric conversion module 60A and is discharged through an exhaust outlet 48. Air discharged through the exhaust outlet 48 is released out of the information processor 10 through an exhaust portion 50 provided in a side portion of a case 13.

The heat sink 42 and the fan 44 described above are an example of a cooling part for cooling the upper surface of the thermoelectric conversion module 60A, i.e., the surface opposite from the lower surface through which heat from the CPU 20 is absorbed.

The cooling unit 41 cools the host controller 22 and generates power by utilizing heat generated by the host controller 22. The cooling unit 41 includes a thermoelectric conversion module 60B and a heatsink with fins, hereinafter fin 45.

The thermoelectric conversion module 60B is a module for cooling the host controller 22 and generating power by utilizing heat generated by the host controller 22. The thermoelectric conversion module 60B is bonded to the host controller 22, for example, by an adhesive having high thermal conductivity to enable the thermoelectric conversion module 60B to receive heat from the host controller 22 through its lower surface. The thermoelectric conversion module 60B of this embodiment has operating modes including a cooling mode and a power generation mode, as does the thermoelectric conversion module 60A.

The fin 45 is bonded to the upper surface of the thermoelectric conversion module 60B to radiate heat from the upper surface of the thermoelectric conversion module 60B to the interior of the case 13. Heat radiated to the interior of the case 13 is released out of the information processor 10 through an exhaust portion 50 or the like, for example, by a fan provided in the case 13 or by air caused by the fan 44. The fin 45 of this embodiment is an example of a cooling part for cooling the upper surface of the thermoelectric conversion module 60B, i.e., the surface opposite from the lower surface through which heat from the host controller 22 is absorbed.

Figure 3:
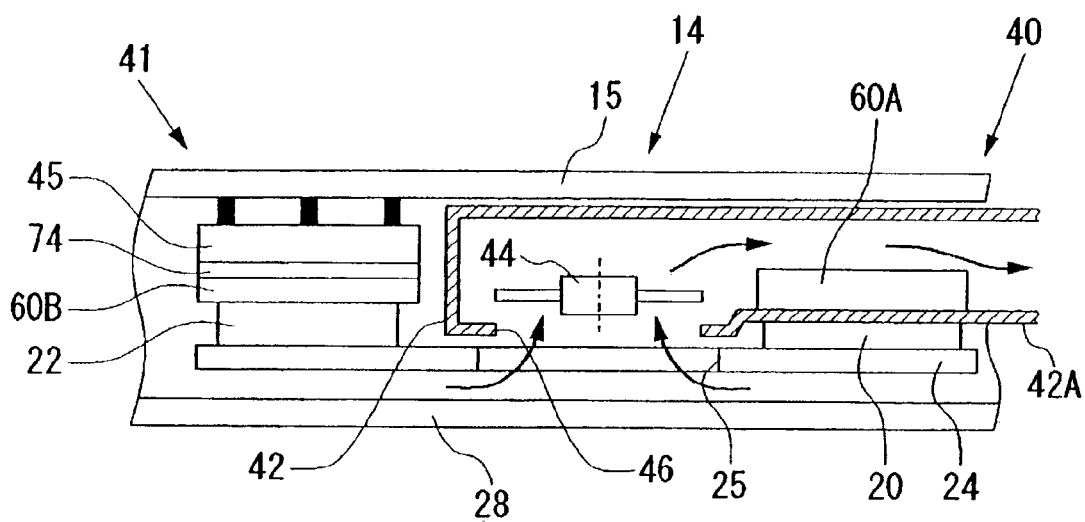
FIG. 3 is a cross-sectional view of a portion of the information processor in which a cooling unit 40 and a cooling unit 41 according to the embodiment of the present invention are provided.

FIG. 3 is a cross-sectional view of a portion of the information processor in which the cooling unit 40 and the cooling unit 41 of this embodiment are provided. The cooling unit 40 and the cooling unit 41 of this embodiment are placed in the case 13 between the upper surface of the motherboard 28 and a supporting plate 15 provided in the lower surface of the keyboard unit 14. The functions of the cooling unit 40 and the cooling unit 41 will be described below in detail.

The cooling unit 40 is provided on the upper surface of the CPU 20. Cooling of the CPU 20 with the cooling unit 40 is performed by two methods described below.

(1) Heat generated by the CPU 20 is dissipated into the thermoelectric conversion module 60A and the entire heat sink 42 through the heat sink bottom surface 42A. Heat dissipated into the upper surface of the thermoelectric conversion module 60A and the entire heat sink 42 is radiated to air drawn into the heat sink 42 by the fan 44 to be expelled to the outside of the information processor 10 through the exhaust outlet 48 and the exhaust portion 50.

In this case, the thermoelectric conversion module 60A may generate power by utilizing heat generated by the CPU 20. The thermoelectric conversion module 60A may generate power by utilizing the difference between the temperature of its lower surface heated by the CPU 20 and the temperature of its upper surface cooled by the heat sink 42 and the fan 44.

(2) If the CPU 20 is not sufficiently cooled by the method (1), the information processor 10 further cools the CPU 20 by causing a current to flow through the thermoelectric conversion module 60A. In this case, the thermoelectric conversion module 60A receives through the heat sink bottom surface 42a its lower surface heat conducted from the CPU 20, and forcibly transfers the heat from its lower surface to its upper surface by using the input current. The heat transferred to the upper surface of the thermoelectric conversion module 60A is radiated to air drawn into the heat sink 42 by the fan 44 to be expelled to the outside of the information processor 10 through the exhaust outlet 48 and the exhaust portion 50.

In the cooling unit 40, the heat sink 42, the fan 44 and the thermoelectric conversion module 60A cooperate with each other to effectively cool the CPU 20 and generate power by utilizing heat generated by the CPU 20.

The cooling unit 41 is provided on the upper surface of the host controller 22. Cooling of the host controller 22 with the cooling unit 41 is performed by two methods described below.

(1) Heat generated by the host controller 22 is conducted to the fin 45 through the thermoelectric conversion module 60B and a cushion member 74 having high thermal conductivity. The fin 45 radiates to the interior of the case 13 the heat conducted through the cushion member 74 from the upper surface of the thermoelectric conversion module 60B.

In this case, the thermoelectric conversion module 60B may generate power by utilizing heat generated by the host controller 22, as does the thermoelectric conversion module 60A.

(2) If the host controller 22 is not sufficiently cooled by the method (1), the information processor 10 further cools the host controller 22 by causing a current to flow through the thermoelectric conversion module 60B. In this case, the thermoelectric conversion module 60B receives through its lower surface heat conducted from the host controller 22, and forcibly transfers the heat from its lower surface to its upper surface by using the input current. The heat transferred to the upper surface of the thermoelectric conversion module 60B is conducted to the fin 45 through the cushion member 74 to be radiated to the interior of the case 13.

In an alternate embodiment, each of the cooling parts constituted by the heat sink 42 and the fan 44 and the cooling parts constituted by the fin 45 and the cushion member 74 may have a heat pipe for cooling the thermoelectric conversion module 60A or the thermoelectric conversion module 60B. More specifically, the cooling part constituted by the fin 45 may conduct heat from the thermoelectric conversion module 60B to the fin 45 by using a heat pipe in place of the cushion member 74 for example. In this case, the fin 45 may be placed between the exhaust outlet 48 and the exhaust portion 50 and heat may be conducted from the thermoelectric conversion module 60B to fin 45 by using the heat pipe. The fin 45 is thereby enabled to dissipate heat to air which is to be discharged through the exhaust outlet 48, thus cooling the thermoelectric conversion module 60B.

Figure 4:
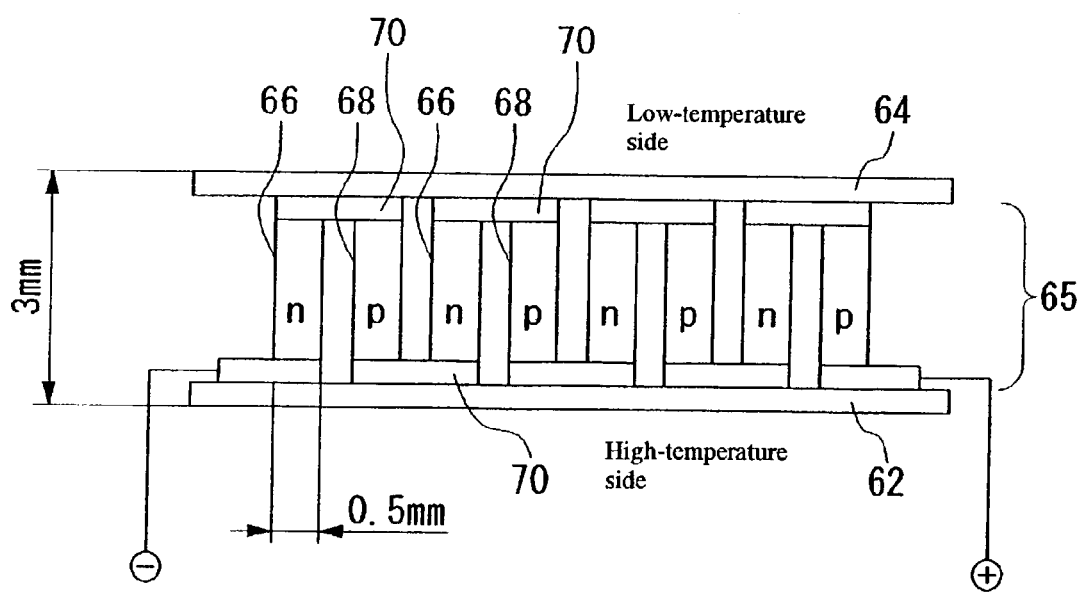
FIG. 4 is a diagram showing the construction of a thermoelectric device 60 according to the embodiment of the present invention.

FIG. 4 shows the construction of a thermoelectric device 60 which constitutes the thermoelectric conversion module 60A and the thermoelectric conversion module 60B of this embodiment. The thermoelectric conversion module 60A is constructed by disposing four thermoelectric devices 60 described below. The thermoelectric conversion module 60B is constructed generally in the same manner as the thermoelectric conversion module 60A.

The thermoelectric device 60 of this embodiment includes a heat-receiving portion 62, a heat-radiating portion 64, and a thermoelectric conversion portion 65.

The heat-receiving portion 62 is an insulating member of high thermal conductivity, which receives heat conducted from an external heat-generating member such as the CPU 20 or the host controller 22. The heat-receiving portion 62 is positioned below the thermoelectric conversion module 60A or the thermoelectric conversion module 60B, as shown in FIG. 2 or 3. The heat-radiating portion 64 is an insulating member of high thermal conductivity, which radiates heat conducted from the heat-receiving portion 62 to the cooling part.

The thermoelectric conversion portion 65 includes n-type semiconductor elements 66, p-type semiconductor elements 68, and electrodes 70. The n-type semiconductor elements 66 and the p-type semiconductor elements 68 are alternately disposed between the heat-receiving portion 62 and the heat-radiating portion 64 and are electrically connected in series by the electrode to form a pi shaped or hereinafter pi coupling.

The thermoelectric conversion portion 65 is arranged so as to be able to absorb heat from the heat-receiving portion 62 and has operating modes including a cooling mode of cooling the heat-receiving portion 62 by being supplied with a current and a power generation mode of generating power by converting heat received from the heat-receiving portion 62 into a current.

In the cooling mode, the thermoelectric conversion portion 65 of this embodiment cools the heat-receiving portion 62 by utilizing the Peltier effect. More specifically, in the cooling mode, the information processor 10 inputs a current so that a current flows in each n-type semiconductor element 66 in the direction from heat-radiating portion 64 to the heat-receiving portion 62 and a current flows in each p-type semiconductor element 68 in the direction from heat-receiving portion 62 to the heat-radiating portion 64. In this event, in the n-type semiconductor element 66, electrons absorb thermal energy at the electrode 70 on the heat-receiving portion 62 side, then move to the electrode 70 on the heat-radiating portion 64 side, and release thermal energy at the electrode 70 on the heat-radiating portion 64 side. Similarly, in the p-type semiconductor element 68, holes absorb thermal energy at the electrode 70 on the heat-receiving portion 62 side, move to the electrode 70 on the heat-radiating portion 64 side, and release thermal energy at the electrode 70 on the heat-radiating portion 64 side. As a result, thermal energy is transferred from the electrodes 70 on the heat-receiving portion 62 side to the electrodes 70 on the heat-radiating portion 64 side through the n-type semiconductor elements 66 and the p-type semiconductor elements 68.

In the power generation mode, the thermoelectric conversion portion 65 of this embodiment converts heat from the heat-receiving portion 62 into a current by utilizing the Seebeck effect. More specifically, in each n-type semiconductor element 66 in the power generation mode, electrons at the electrode 70 on the heat-receiving portion 62 side receive thermal energy to have their kinetic energy increased, so that the electrons move to the electrode 70 on the heat-radiating portion 64 side. Similarly, in each p-type semiconductor element 68, holes at the electrode 70 on the heat-receiving portion 62 side receive thermal energy to have their kinetic energy increased, so that the holes move to the electrode 70 on the heat-radiating portion 64 side. The kinetic energy of electrons and holes at the electrodes 70 on the heat-radiating portion 64 side is converted into thermal energy to be dissipated through the heat-radiating portion 64. Electron and holes move as described above to cause currents through the n-type semiconductor elements 66, the p-type semiconductor elements 68 and the electrodes 70. In this manner, the thermoelectric device 60 can generate power.

Figure 5:
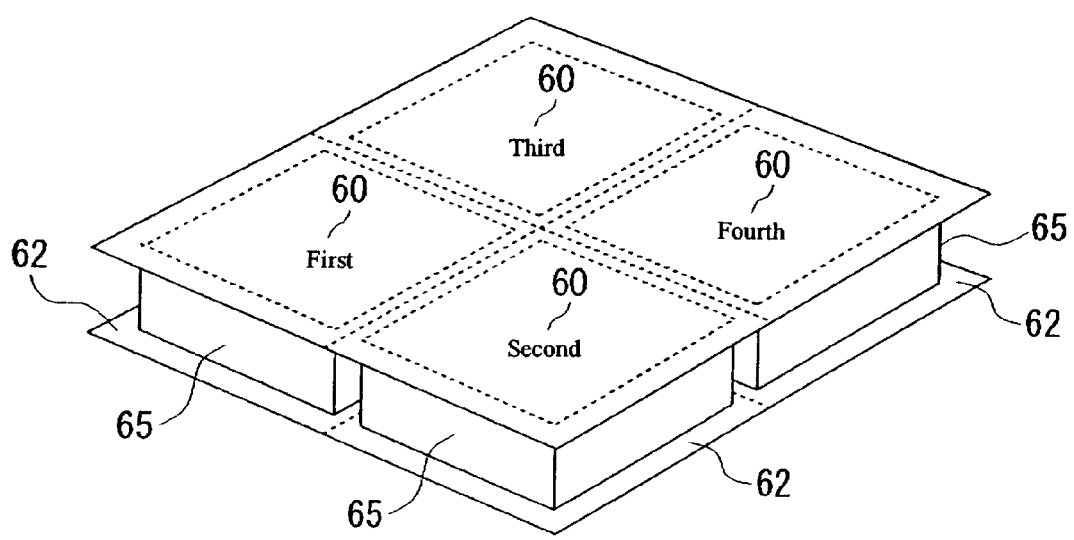
FIG. 5 is a diagram showing the construction of a thermoelectric conversion module 60A according to the embodiment of the present invention.

FIG. 5 shows the construction of the thermoelectric conversion module 60A of this embodiment. The thermoelectric conversion module 60A of this embodiment is constructed by disposing, in grid form, four thermoelectric devices 60 shown in FIG. 4.

At the bottom side of the thermoelectric conversion module 60A, four heat-receiving portions 62 which receive heat conducted from the CPU 20 are placed in grid form in one-to-one correspondence with first to fourth thermoelectric devices 60. The thermoelectric conversion portions 65 in the first to fourth thermoelectric devices 60 are provided in different regions defined by dividing the thermoelectric conversion module 60A into a plurality of regions. The thermoelectric conversion portions 65 are provided in one-to-one correspondence with the four heat-receiving portions 62. The operating mode of each thermoelectric conversion portion 65 can be independently selected to operate in the cooling mode of being supplied with a current to cool the corresponding heat-receiving portion 62 or in the power generation mode of converting heat received from the heat-receiving portion 62 into a current.

The CPU 20 has various logic blocks, e.g., an instruction decoder, an integer arithmetic unit, a floating point arithmetic unit, a cache memory and a memory control circuit. The power consumption of each logic block varies depending on the kind of program executed by the CPU 20. Therefore a situation may occur in which some of a plurality of regions of the CPU 20 need cooling while the other regions do not need cooling. It is possible for the information processor 10 to independently select the most suitable operating mode for each of the first to fourth thermoelectric conversion portions 65 corresponding to the four regions of the CPU 20 according to the operating conditions of the CPU 20 by using the thermoelectric conversion module 60A of this embodiment.

Figure 6:
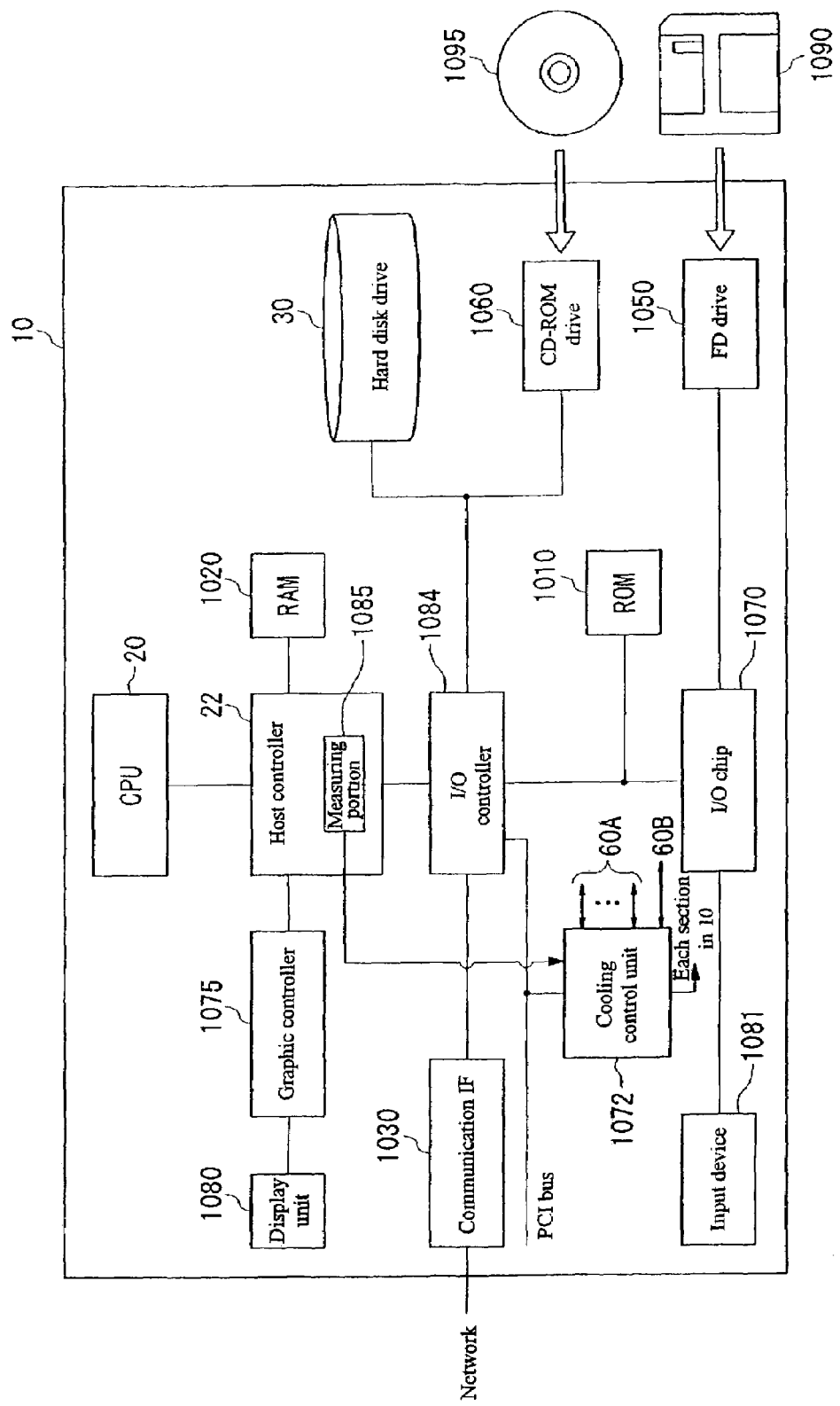
FIG. 6 is a diagram showing a hardware construction of the information processor 10 according to the embodiment of the present invention.

FIG. 6 shows an example of a hardware configuration of the information processor 10 of this embodiment. The information processor 10 of this embodiment has a CPU peripheral section which has the CPU 20, a RAM 1020, an information processing unit 1075 and a display unit 1080, and in which the components are connected to each other by the host controller 22, a section around the CPU, containing the display unit 1080 a communication interface 1030 connected to the host controller 22 by an input/output controller 1084, an input/output section having a hard disk drive 30, a compact disk-read only memory (CD-ROM) drive 1060 and a cooling control unit 1072, and a legacy input/output section which has a ROM 1010, a floppy disk drive 1050, an input/output chip 1070, and input device 1081, and in which the components are connected to input/output controller 1084.

The host controller 22 is an integrated circuit which is a heat-generating part from which heat is conducted to the heat-receiving portion of the thermoelectric conversion module 60B. The host controller 22 includes a measuring portion 1085 for measuring the temperature of the host controller 22 acting as a heat-generating part. The measuring portion 1085 is a device such as heat sensor for measuring the temperature. The measuring portion 1085 is provided on the integrated circuit of the host controller 22 or the LSI package in which the host controller 22 is mounted.

The host controller 22 connects, to the RAM 1020, the CPU 20 and the information processing unit 1075, each of which accesses the RAM 1020 at a high transfer rate.

The CPU 20 is an-integrated circuit which is a heat-generating part from which heat is conducted to each heat-receiving portion 62 in the thermoelectric conversion module 60A. The CPU 20 operates on the basis of programs stored in the ROM 1010 and the RAM 1020 to control each section. The information processing unit 1075 obtains image data which is produced, for example, by the CPU 20 on a frame buffer provided in the RAM 1020, and displays the image data on the display unit 1080. Alternatively, the information processing unit 1075 may incorporate a frame buffer for storing image data produced by the CPU 20 for example.

The input/output controller 1084 connects, to the host controller 22, each of the communication interface 1030, which is an input/output device of a comparatively high speed, the hard disk drive 30, the CD-ROM drive 1060, and the cooling control unit 1072. The communication interface 1030 performs communication with other units over a network. The hard disk drive 30 stores programs and data used by the information processor 10. The CD-ROM drive 1060 reads a program or data from the CD-ROM 1095 and installs the read program or data in the hard disk drive 30. The cooling control unit 1072 makes a setting as to in which operating mode each of the thermoelectric conversion portions 65 in the thermoelectric conversion module 60A and the thermoelectric conversion portion 65 in the thermoelectric conversion module 60B will be operated according to an instruction from a cooling control program running on the CPU 20.

To the input/output controller 1084 are also connected the ROM 1010 and the input/output devices having a comparatively low operating speed, i.e., the floppy disk drive 1050, the input/output chip 1070, and the input device 1081. In the ROM 1010 are stored a boot program executed by the CPU 20 at the time of startup of the information processor 10, a program which depends on the hardware of the information processor 10, etc. The floppy disk drive 1050 reads output a program or data from a floppy disk 1090 and installs the read program or data in the hard disk drive 30. The input/output chip 1070 connects floppy disk 1090 and various input/output devices, for example, through a parallel port, a serial port, a keyboard port and a mouse port. The input device 1081 controls the keyboard unit 14 to transmit input key data to the input/output chip 1070.

According to the cooling control program running on the CPU 20, the cooling control unit 1072 is made to operate as a selecting portion to select the cooling mode or the power generation mode in which each of the thermoelectric conversion portion 65 should be operated according to the temperature condition of the corresponding CPU 20 portion or the host controller 22.

The cooling control program is provided to a user by being stored on a recording medium such as floppy disk 1090, CD-ROM 1095 or an IC card (not shown). The cooling control program is read out from the recording medium, installed in the hard disk drive 30 and executed in the information processor 10.

The cooling control program provided to the information processor 10 by being stored on a recording medium has a selecting module which is a program for enabling the information processor 10 to operate as a selecting part.

The above-described programs or modules may be stored on an external storage medium. As such a storage medium, optical recording mediums, e.g., a digital versatile disk (DVD) and a phase change rewritable disk, magnetooptic disks, e.g., MiniDisc, tape mediums, and semiconductor memories, e.g., an IC card may be used as well as floppy disk 1090, CD-ROM 1095. Also, a storage device such as a hard disk or a RAM provided in a server system connected to a private communication network or the internet may be used as a recording medium to provide programs to the information processor 10.

Figure 7:
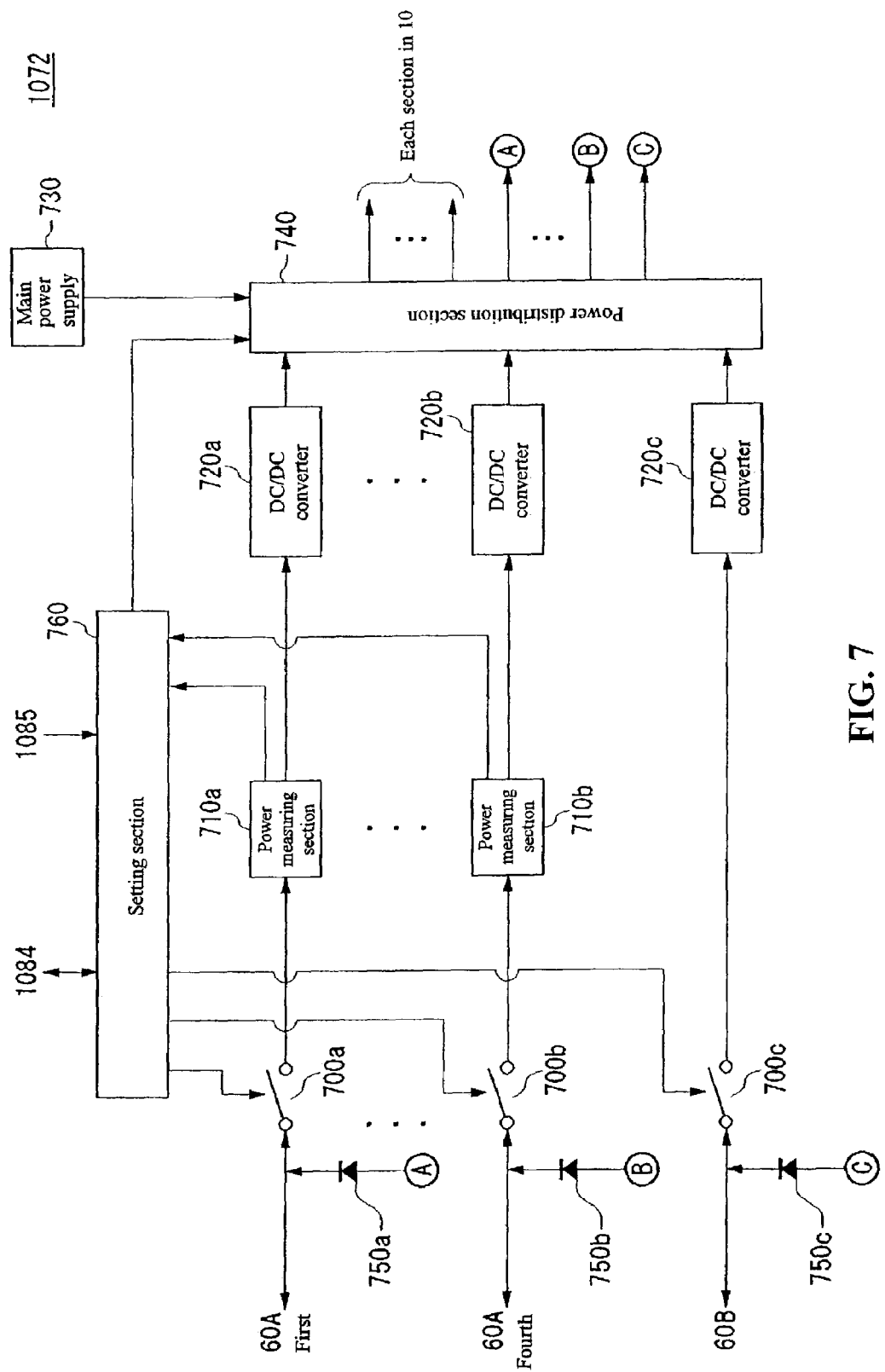
FIG. 7 is a diagram showing a hardware construction of a cooling control unit 1072 according to the embodiment of the present invention.

FIG. 7 shows a hardware configuration of the cooling control unit 1072 of this embodiment. The cooling control unit 1072 of this embodiment includes switches 700a to 700c, power measuring sections 710a and 710b, DC/DC converters 720a to 720c, a main power supply section 730, a power distribution section 740, rectifiers 750a to 750c, and a setting section 760.

Each of the switches 700a to 700c is set in a conductive state by the setting section 760 when the power generation mode is selected. In this state, each of the switches 700a to 700c supplies a current output from a positive electrode of the corresponding one of the thermoelectric conversion portions 65 in the thermoelectric conversion modules 60A and 60B to the corresponding one of the power measuring sections 710a, the power measuring section 710b, and the DC/DC converter 720c. When the cooling mode is selected, each of the switches 700a to 700c is set in a cut or open state by the setting section 760.

The power measuring portions 710a and 710b respectively measure electromotive forces of the thermoelectric conversion portions 65 in the thermoelectric conversion module 60A connected in the power generation mode. According to the cooling control program, the temperature difference of each heat-receiving portion 62 from the temperature of the heat-radiating portion 64 used as a reference is computed on the basis of the power value measured with the corresponding one of the power measuring sections 710a to 710b in the power generation mode. Then, according to the cooling control program, one of the cooling mode and the power generation mode in which each of the thermoelectric conversion portions 65 in the thermoelectric conversion module 60A should be operated is selected on the basis of the computed temperature difference.

Each of the DC/DC converters 720a to 720c performs, for examples, boosting so that the voltage value of power output from the corresponding one of the thermoelectric conversion portions 65 in the thermoelectric conversion module 60A coincides with a voltage value output from a main power supply section 730.

The main power supply section 730 converts the voltage value and the current value of the battery of the information processor 10 or power input to the information processor 10 into the values of the voltage and current used in the information processor 10.

A power distribution section 740 redistributes powers input from the DC/DC converters 720a to 720c and the main power supply section 730 to the thermoelectric conversion portions 65 in the thermoelectric conversion module 60A, the thermoelectric conversion portion 65 in the thermoelectric conversion module 60B, and the sections of the information processor 10. For example, in a case where the first thermoelectric device 60 in the thermoelectric conversion module 60A is operating in the power generation mode while the second thermoelectric device 60 in the thermoelectric conversion module 60A is operating in the cooling mode, the power distribution section 740 enables by the above-described power redistribution the thermoelectric conversion portion 65 in the second thermoelectric device 60 to use the current output from the thermoelectric conversion portion 65 in the first thermoelectric device 60 to cool the heat-receiving portion 62 in the second thermoelectric device 60.

Each of rectifiers 750*a* to 750*c* inputs to the corresponding one of the thermoelectric conversion portions 65 the current output from the power distribution section 740 to the thermoelectric conversion portion 65 in the cooling mode. When one of the thermoelectric conversion portion 65 is in the power generation mode, the corresponding one of the rectifiers 750*a* to 750*c* prevents the generated current from flowing backward to the output of the power distribution section 740.

The setting section 760 sets the operation of each section of the cooling control unit 1072 according to an instruction from the cooling control program running on the CPU 20. More specifically, when one of the thermoelectric device 60 is operated in the power generation mode, the cooling control unit 1072 sets in the conductive state one of the switches 700*a* to 700*c* corresponding to the thermoelectric device 60 and stops the current output from the power distribution section 740 to the thermoelectric device 60. Also when one of the thermoelectric device 60 is operated in the cooling mode, the cooling control unit 1072 sets in the cut or open state one of the switches 700*a* to 700*c* corresponding to the thermoelectric device 60 and makes the power distribution section 740 output the current to the thermoelectric device 60. In this case, the setting section 760 may change the cooling power by changing the current value output from the power distribution section 740 to the thermoelectric device 60 on the basis of the temperature condition in the thermoelectric device 60.

Figure 8:
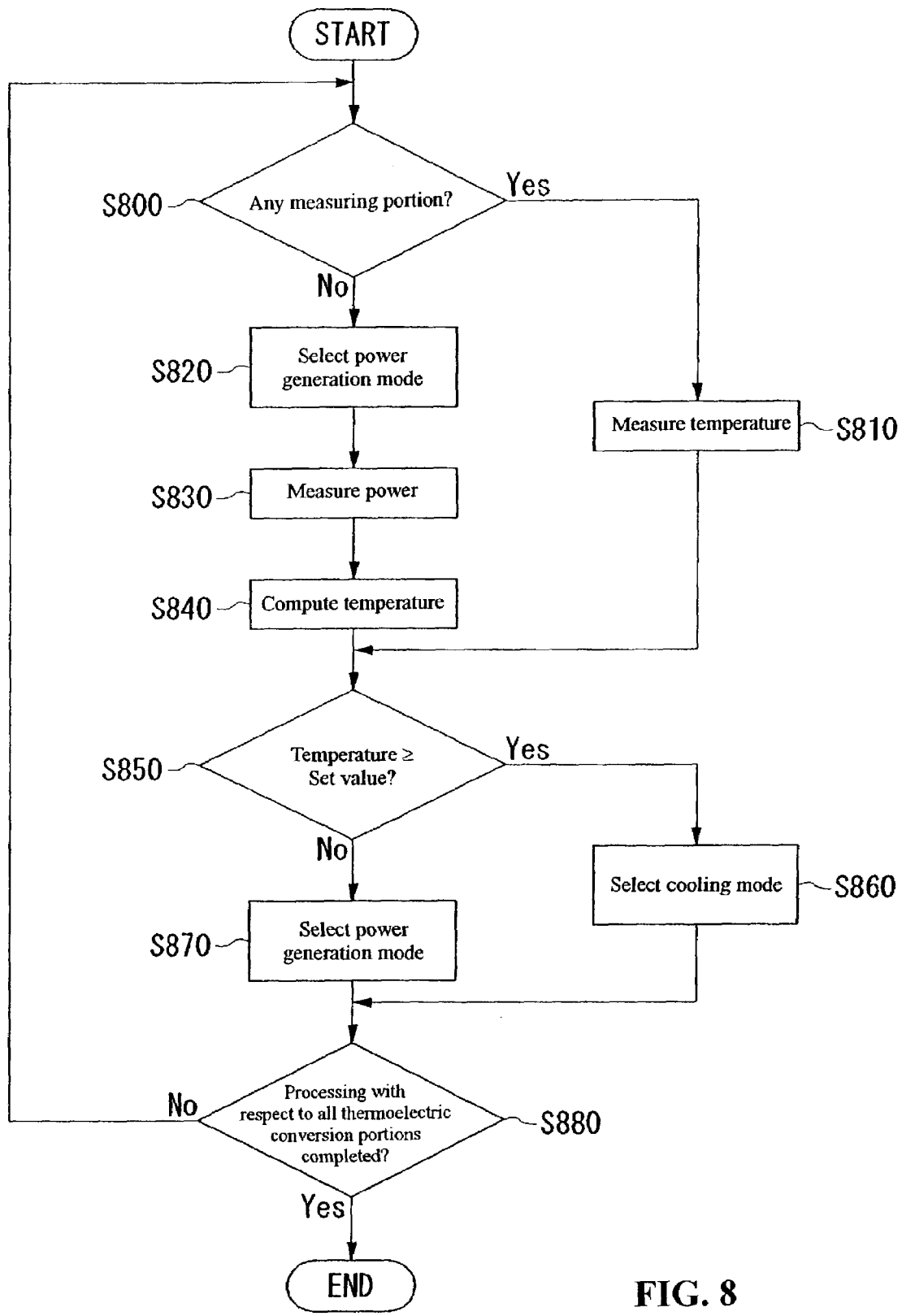
FIG. 8 is a flowchart of a cooling control program executed on the information processor 10 according to the embodiment of the present invention.

FIG. 8 shows the process of the cooling control program executed in the information processor 10 of this embodiment.

First, according to the cooling control program, one of all the thermoelectric conversion portions 65 in the thermoelectric conversion modules 60A and 60B is selected as a processing object. A determination is then made as to whether measuring portion 1085 is provided in correspondence with the thermoelectric conversion portion 65 selected as an object of processing (S800).

If the processing-object thermoelectric conversion portion 65 belongs to the thermoelectric conversion module 60B, the corresponding measuring portion 1085 is provided. In this case, the selecting module of the cooling control program conducts a measurement of the temperature of the host controller 22 with the measuring portion 1085 (S810).

If the processing-object thermoelectric conversion portion 65 belongs to the thermoelectric conversion module 60A, no measuring portion 1085 is provided. The selecting module makes the setting portion 760 in the cooling control unit 1072 temporarily set the processing-object thermoelectric conversion portion 65 in the power generation mode (S820). Next, the selecting module conducts a measurement of the electromotive force of the processing-object thermoelectric conversion portion 65 with the corresponding one of the power measuring sections 710*a* to 710*b* (S830). Then, the selecting module conducts computation of the temperature in the corresponding region of the CPU 20 on the basis of the electromotive force measured in S830 (S840).

Next, the selecting module compares the result of the temperature measurement in S810 or S840 with a set value which is a temperature threshold value set in advance (S850).

If the selecting module determines that the temperature of the heat-generating portion corresponding to the processing-object thermoelectric device 60 is equal to or higher than the set value, it selects the cooling mode as the operating mode of the thermoelectric conversion portion and makes the setting section 760 set the processing-object thermoelectric device 60 in the cooling mode (S860). If the selecting module determines that the temperature of the heat-generating portion corresponding to the processing-object thermoelectric device 60 is lower than the set value, it selects the power generation mode as the operating mode of the thermoelectric conversion portion and makes the setting section 760 set the processing-object thermoelectric device 60 in the power generation mode (S870).

According to the cooling control program, processing from S800 to S870 are successively performed with respect to each thermoelectric conversion portion 65 until the processing from S800 to S870 are completed with respect to all the thermoelectric conversion portions 65 (S880).

By the above-described processing from S820 to S850, the selecting module of the cooling control program selects the power generation mode as the operating mode of each thermoelectric conversion portion 65 by predetermined timing determined according to the programmed operation. The selecting module then conducts computation of the temperature difference of the heat-receiving portion 62 from the reference temperature on the basis of the power value output from the thermoelectric conversion portion 65 in the power generation mode to enable selection on the basis of the temperature difference of one of the operating modes in which the thermoelectric conversion portion 65 should be operated. Alternatively, the selecting module may conduct the processing from S820 to S850 by using timing based on a predetermined period. Also, the selecting module may determine the timing of the processing from S820 to S850, for example, according to the temperature measured in S840 in accordance with a predetermined algorithm. More specifically, for example, if the selecting module determines that the temperature of the heat-receiving portion 62 obtained by immediately preceding measurement exceeds the set value by an amount equal to or larger than a certain amount, it may set the period before the next execution of the processing from S820 to S850 longer in comparison with the case where the temperature of the heat-receiving portion 62 does not exceed the set value by an amount equal to or larger than the certain amount.

In the processing in step 840 described above, the selecting module may also conduct computation of the temperature of the heat-receiving portion 62 by addition of the temperature difference between the heat-receiving portion 62 and the heat-radiating portion 64 derived from the Seebeck effect and the reference temperature, i.e., the temperature of the heat-radiating portion 64. For this computation, the selecting module may conduct a measurement of the reference temperature, for example, with temperature sensors for measuring the temperature of the heat-radiating portion 64 and the temperature of air outside the information processor 10. Alternatively, the selecting module may use as a reference temperature a predetermined value, e.g., a high-temperature-side limit value with respect to an operating temperature condition of the information processor 10, or a value determined by adding a margin to the high-temperature-side limit value.

In the processing in step 850 described above, the selecting module may use only one set value as a threshold value of the temperatures of different heat-receiving portions 62 and may use different set values according to the operating temperature range of CPU 20 or the host controller 22 to be cooled.

Also, in the processing in step 850 described above, the selecting module may select the cooling mode as the operating mode of the thermoelectric conversion portion 65 if it determines that the temperature of the corresponding processing-object heat-generating portion is equal to or higher than a first temperature set in advance, and may select the power generation mode as the operating mode of the thermoelectric conversion portion 65 if it determines that the temperature of the corresponding processing-object heat-generating portion is lower than a second temperature set in advance as a temperature lower than the first temperature. In this case, when the selecting module determines that the temperature of the processing-object heat-generating portion is a temperature equal to or higher than the second temperature and lower than the first temperature, it may set as the operating mode of the corresponding thermoelectric conversion portion 65 an operating mode other than the cooling mode and the power generation mode, e.g., an operation halt mode in which input or output of a current to or from the thermoelectric conversion portion 65 is not performed.

The above-described cooling device having the cooling unit 40, the cooling unit 41, and the cooling program can operate by suitably selecting the cooling mode and the power generation mode of each thermoelectric device 60 in the thermoelectric conversion module 60A and/or the thermoelectric device 60 in the thermoelectric conversion module 60B on the basis of the temperature conditions of CPU 20 and/or the host controller 22. Thus, the cooling device having the cooling unit 40, the cooling unit 41, and the cooling program is capable of performing both power generation and cooling with efficiency and makes it possible to provide information processor 10 with reduced power consumption.

Figure 9:
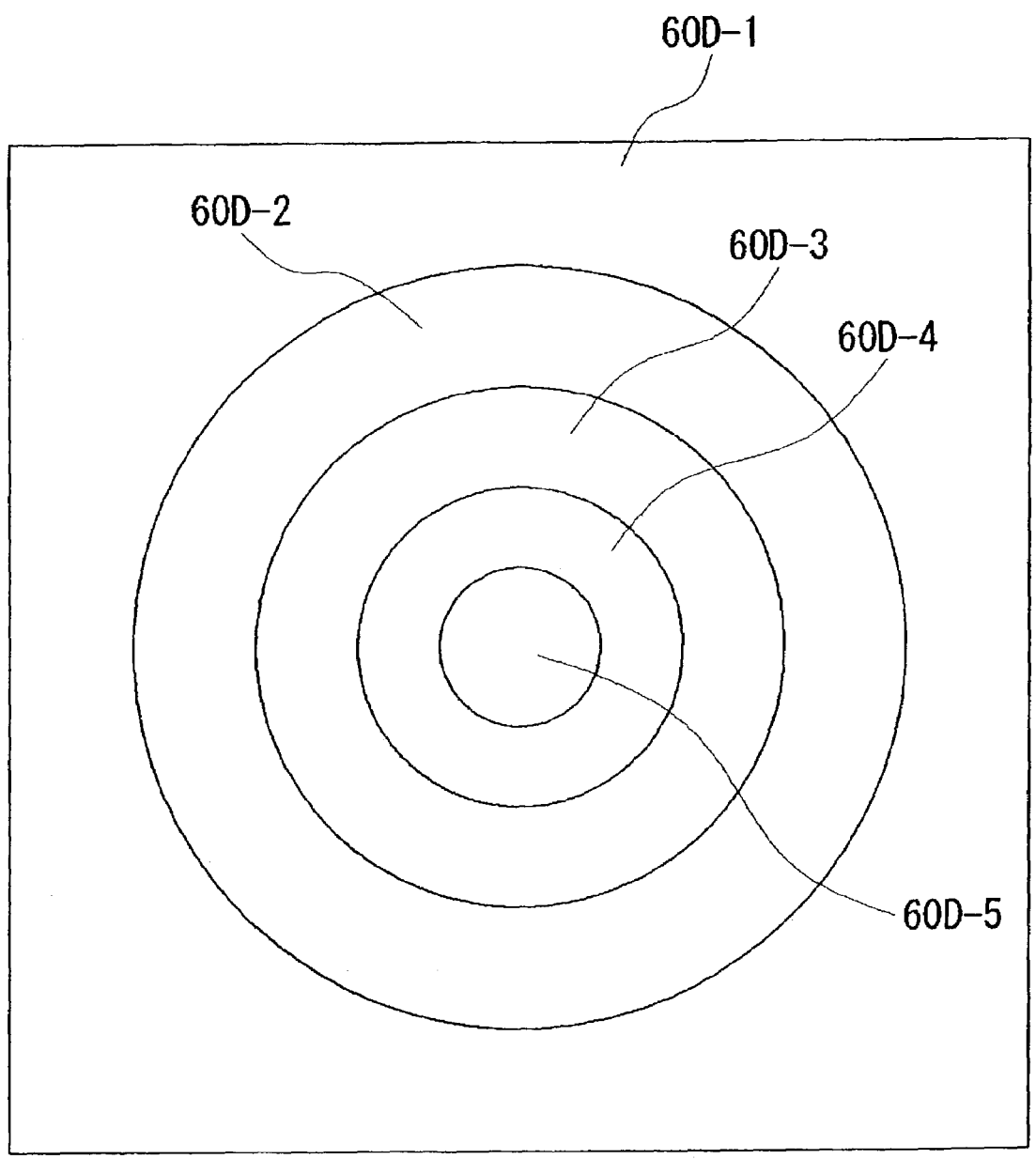
FIG. 9 is a diagram showing the construction of a thermoelectric conversion module 60D in a first modification of the embodiment of the present invention.

FIG. 9 shows the construction of a thermoelectric conversion module 60D in a first modification of the embodiment of the present invention. The information processor 10 in this modification uses the thermoelectric conversion module 60D in place of the thermoelectric conversion module 60A as a module for performing cooling of CPU 20 and/or generating power by utilizing heat generated by the CPU 20.

As shown in FIG. 9, the thermoelectric conversion module 60D is constructed by concentrically placing thermoelectric devices 60D-1 to 60D-5 each having the same construction as the thermoelectric device 60 shown in FIG. 4. The heat-receiving portions 62 of the thermoelectric devices 60D-1 to 60D-5 are placed so as to form one surface. The heat-receiving portions 62 of the thermoelectric devices 60D-1 to 60D-5 are formed in doughnut-like shapes substantially circular and concentric with each other. The heat-receiving portion 62 of the thermoelectric device 60D-1 has a hollow inner space for placement of the heat-receiving portions 62 of the thermoelectric devices 60D-2 to 60D-5 in inner concentric positions. Similarly, the heat-receiving portion 62 of each of the thermoelectric devices 60D-2 to 60D-4 has a hollow inner space for placement of the heat-receiving portions 62 of the thermoelectric devices 60D-3 to 60D-5, or 60D-4 and 60D-5, or the heat-receiving portion 62 of the thermoelectric device 60D-5 in the inner concentric position.

Figure 10:
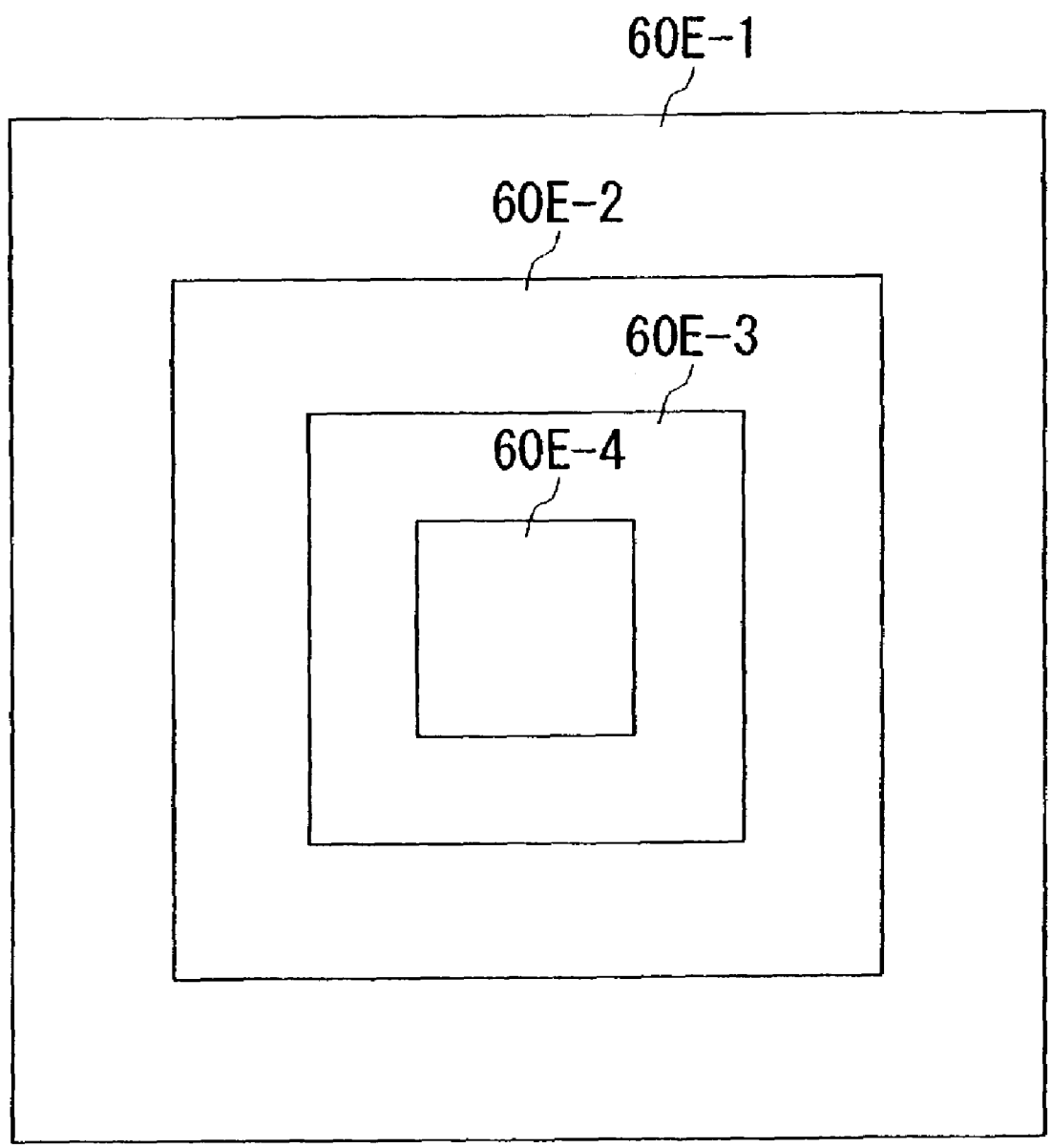
FIG. 10 is a diagram showing the construction of a thermoelectric conversion module 60E in a second modification of the embodiment of the present invention.

FIG. 10 shows the construction of a thermoelectric conversion module 60E in a second modification of the embodiment of the present invention. The information processor 10 in this modification uses the thermoelectric conversion module 60E in place of the thermoelectric conversion module 60A as a module for performing cooling of CPU 20 and/or generating power by utilizing heat generated by the CPU 20.

As shown in FIG. 10, the thermoelectric conversion module 60E is constructed by placing thermoelectric devices 60E-1 to 60E-4 each having the same construction as the thermoelectric device 60 shown in FIG. 4. The heat-receiving portions 62 of the thermoelectric devices 60E-1 to 60E-4 are placed so as to form one surface. The heat-receiving portion 62 of the thermoelectric device 60E-1 has a hollow inner space for placement of the heat-receiving portions 62 of the thermoelectric devices 60E-2 to 60E-4 in inner positions in the surface formed by the heat-receiving portions 62. Similarly, the heat-receiving portion 62 of the thermoelectric device 60E-2 or 60E-3 has a hollow inner space for placement of the heat-receiving portions 62 of the thermoelectric devices 60E-3 and 60E-4, or the heat-receiving portion 62 of the thermoelectric device 60E-4 in the inner position in the surface formed by the heat-receiving portions 62.

If the cooling device having the above-described thermoelectric conversion module 60D or thermoelectric conversion module 60E is used, the information processor 10 can operate the portions of the thermoelectric conversion module 60D or 60E in different operating modes in correspondence with central and peripheral portions of the CPU 20 in a case where heat is dissipated from a central portion of the CPU 20 through the heat-receiving portion 62 or a heat-conducting member or the like provided between the CPU 20 and the thermoelectric conversion module 60D or 60E. Therefore the information processor 10 can make suitable cooling and power generation settings in correspondence with the central and peripheral portions of the CPU 20 by using the thermoelectric conversion module 60D or 60E.

Figure 11:
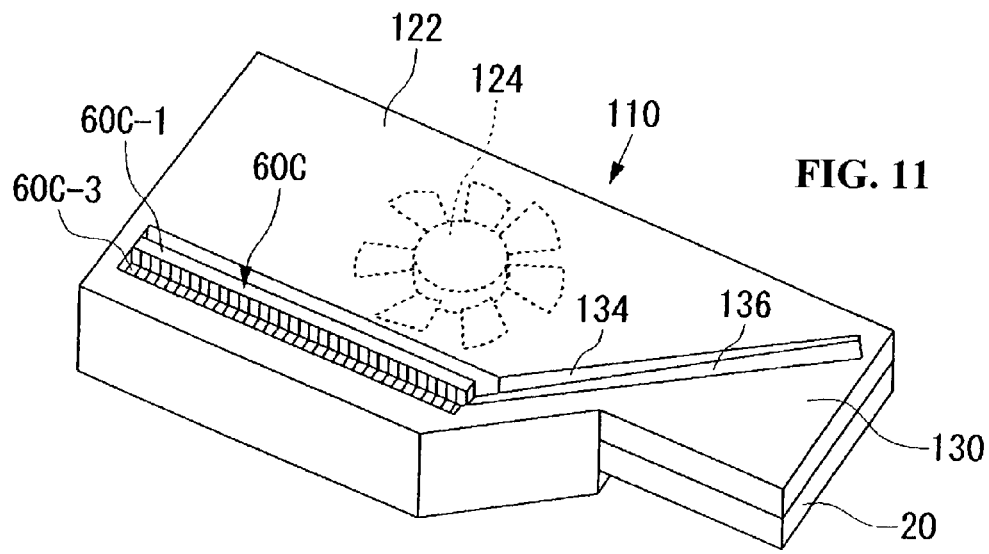
FIG. 11 is a diagram showing an external appearance of a cooling unit 110 in a third modification of the embodiment of the present invention.
Figure 12:
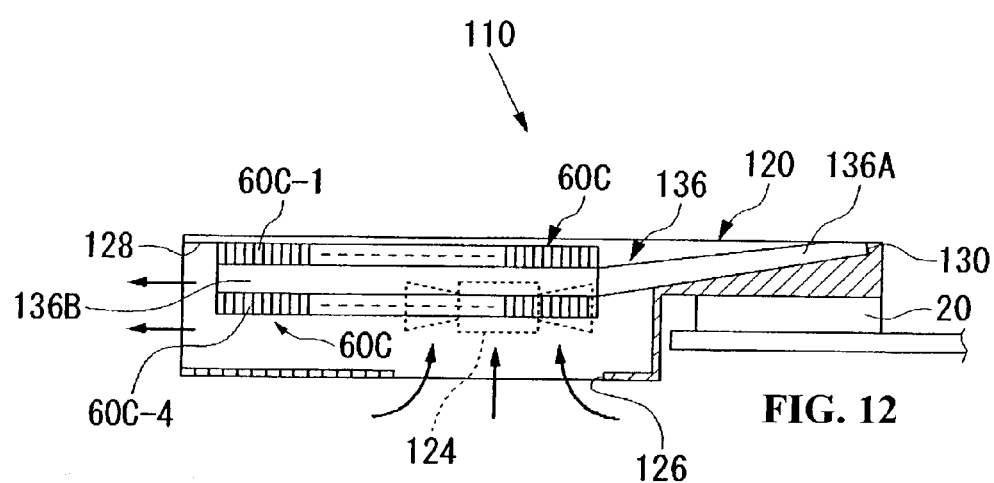
FIG. 12 is a cross-sectional view of the cooling unit 110 in the third modification of the embodiment of the present invention.

FIGS. 11 and 12 respectively show an external appearance and a cross section of a cooling unit 110 in a third modification of the embodiment of the present invention. In the information processor 10 in this modification uses the cooling unit 110 in place of the cooling unit 40 to cool the CPU 20 and/or generate power by utilizing heat generated by the CPU 20. The cooling unit 110 in this modification is an example of a cooling part for cooling a heat-radiating portion 64 located opposite from a heat pipe 136 of a thermoelectric conversion module 60C.

The cooling unit 110 is connected to the upper surface of the CPU 20 in a connection portion 130. The cooling unit 110 includes the thermoelectric conversion module 60C, a heat sink 122, a fan 124, a heat pipe holding portion 134 and the heat pipe 136.

The thermoelectric conversion module 60C cools the CPU 20 and/or generates power by utilizing heat generated by the CPU 20 through the heat pipe 136. The thermoelectric conversion module 60C is constructed in such a manner that thermoelectric devices 60C-1 to 60C-4 each having the same construction as the thermoelectric device 60 shown in FIG. 4 are placed so as to surround the heat pipe 136. The heat sink 122 forms an air passage for passage of air for cooling the upper surfaces of the thermoelectric devices 60C-1 to 60C-4, as does the heat sink 42.

The fan 124 is placed in the air passage formed in the heat sink 122 to draw air from the outside into the heat sink 122 through an air inlet 126 formed in a portion of the heat sink 122. Air drawn in by the fan 124 cools the upper surfaces of the thermoelectric devices 60C-1 to 60C-4 and is discharged through an exhaust outlet 128. Air discharged through the exhaust outlet 128 is released out of the information processor 10 through an exhaust portion 50 provided in a side portion of a case 13.

The heat pipe holding portion 134 is a channel formed to embed the heat pipe 136 in the heat sink 122. The heat pipe 136 is embedded in the heat pipe holding portion 134. The heat pipe 136 of this embodiment is an example of a heat-conducting part in accordance with the present invention. The heat pipe 136 receives, by its heating end 136A through the connection portion 130, heat generated by the CPU 20 which is a heat-generating member. The heat pipe 136 conducts the heat received through its heating end portion 136A to the heat-receiving portions 62 in the thermoelectric devices 60C-1 to 60C-4. In the cooling mode, the thermoelectric conversion portion 65 in each of the thermoelectric devices 60C-1 to 60C-4 absorbs heat conducted by the heat pipe 136 and dissipate the heat into air passing through the heat sink 122. In the power generation mode, the thermoelectric conversion portion 65 in each of the thermoelectric devices 60C-1 to 60C-4 generates power by utilizing heat conducted by the heat pipe 136. In the cooling unit 110, the body of the heat sink 122 or a member having high thermal conductivity, for example, may be used in place of the heat pipe 136.

Figure 13:
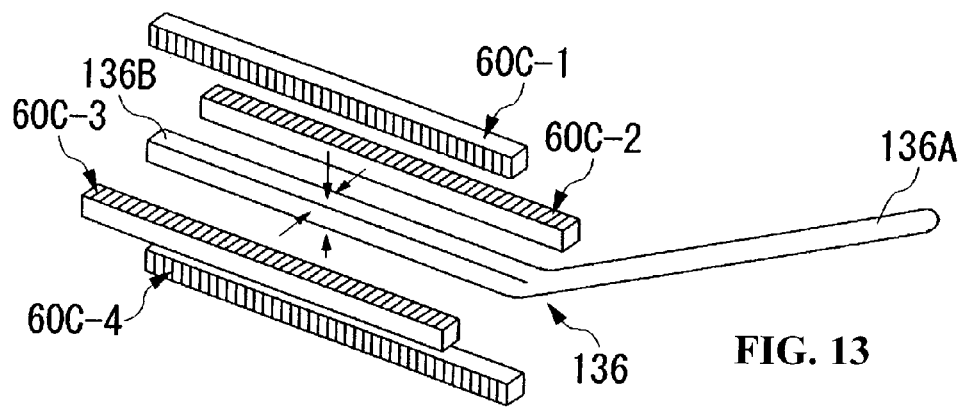
FIG. 13 is a diagram showing a method of attaching thermoelectric conversion modules 60C to a heat pipe 136 in the third modification of the embodiment of the present invention.
Figure 14:
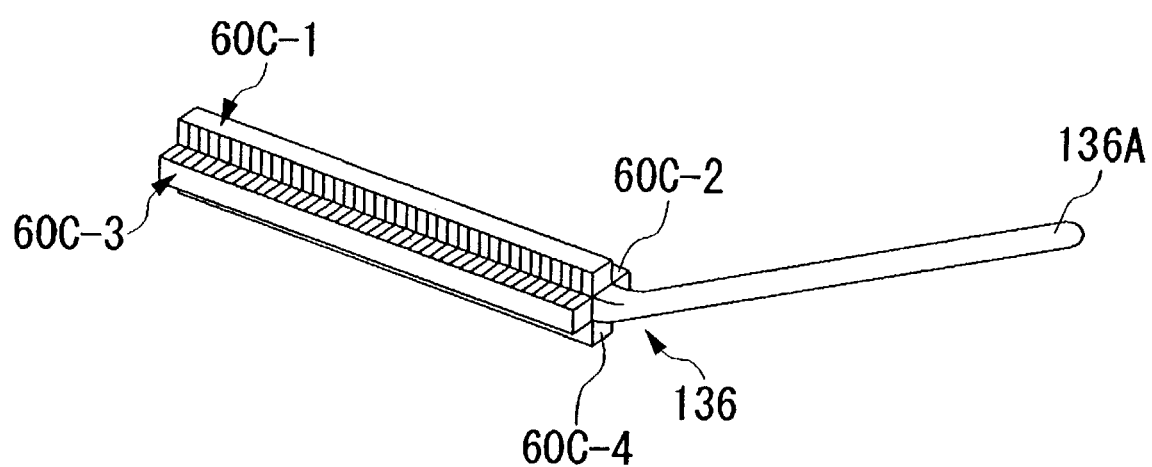
FIG. 14 is a diagram showing a state in which the thermoelectric conversion modules 60C are attached to the heat pipe 136 in the third modification of the embodiment of the present invention.

FIGS. 13 and 14 show a method of attaching the thermoelectric devices 60C-1 to 60C-4 to the heat pipe 136 and the attached state of the thermoelectric devices 60C-1 to 60C-4 in the third modification of the embodiment of the present invention.

In the heat pipe 136, the heating end portion 136A through which heat is absorbed from the connection portion 130 is formed into the shape of a round pipe, while a cooling end portion 136B through which heat is dissipated is formed into the shape of a square pipe. The thermoelectric devices 60C-1 to 60C-4 are attached to the surfaces of the cooling end portion 136B in a one-to-one relationship. That is, the heat-receiving portions 62 of the thermoelectric devices 60C-1 to 60C-4 contact the heat pipe 136 in different outer surface regions of the heat pipe 136.

In the cooling unit 110 in this modification, the thermoelectric conversion portions 65 of the thermoelectric devices 60C-1 to 60C-4 can independently perform cooling or power generation by using heat conducted to the heat-receiving portions 62 through the heat pipe 136. Therefore the information processor 10 can suitably select, according to the temperature condition of the CPU 20, cooling of the CPU 20 or power generation utilizing heat generated by the CPU 20.

Figure 15:
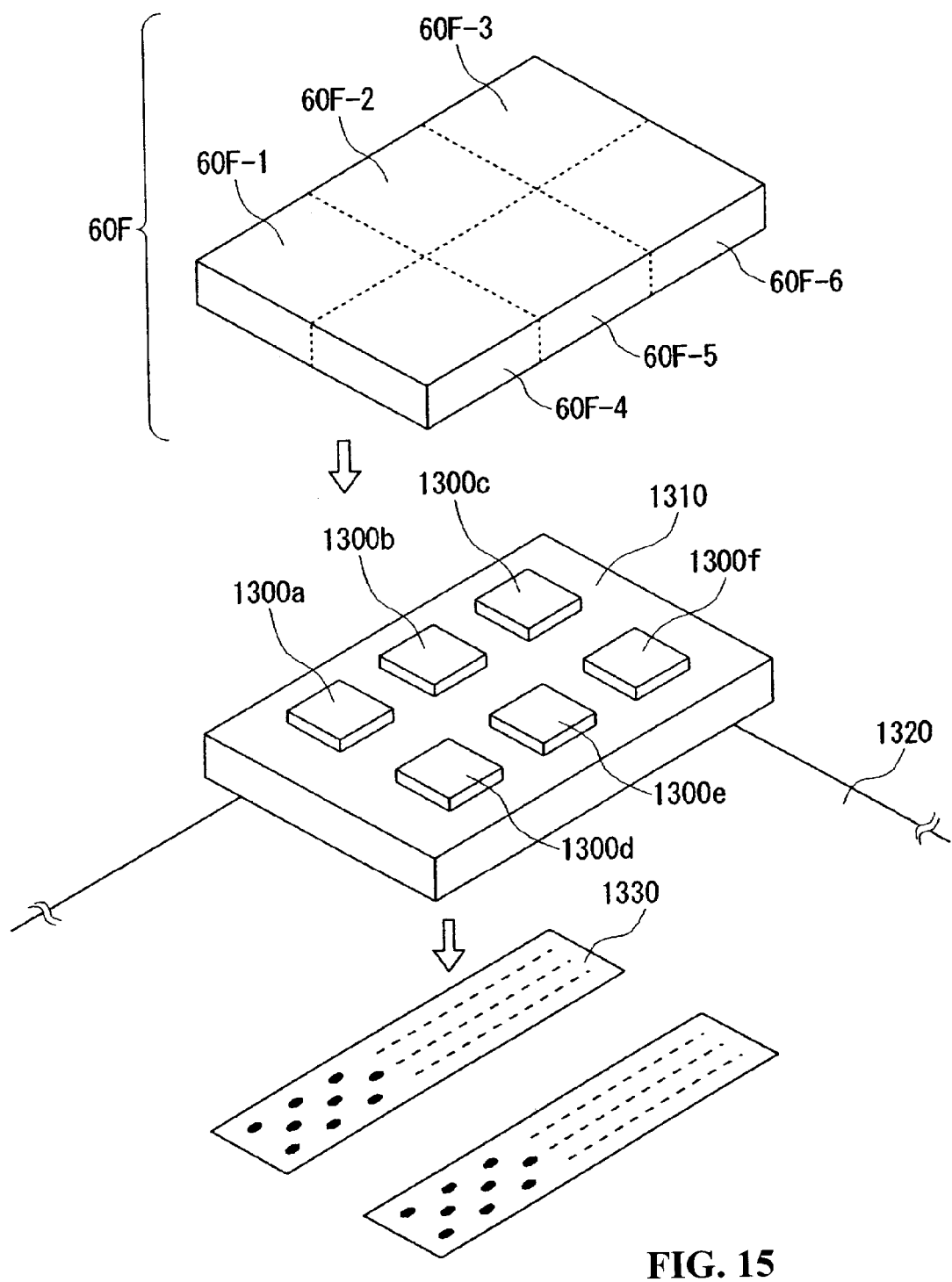
FIG. 15 is a diagram showing a method of attaching a thermoelectric conversion module 60F to a multichip module 1310 in a fourth modification of the embodiment of the present invention.

FIG. 15 shows a method of attaching a thermoelectric conversion module 60F to a multichip module 1310 in a fourth modification of the embodiment of the present invention. In an information processor main unit 12 in this modification, a plurality of integrated circuits including the CPU 20 and the host controller 22 provided in the information processor main unit 12 are mounted in a state of being combined into one multichip module 1310. This modification will be described mainly with respect to changes from the above-described embodiment.

The information processor main unit 12 in this modification has a motherboard 1320 in place of the motherboard 28 shown in FIG. 2. The Motherboard 1320 is a circuit board on which memories such as ROM 1010 and RAM 1020, integrated circuits for controlling internal sections of the information processor 10, etc., are mounted. The motherboard 1320 has a connection portion 1330 for electrically connecting integrated circuits 1300a to 1300f on the multichip module 1310.

The multichip module 1310 is constructed in such a manner that six integrated circuits 1300a to 1300f provided in the information processor main unit 12 are mounted, for example, on a ceramic circuit board to be combined into one module. The integrated circuits 1300a to 1300f may be, for example, the CPU 20, the host controller 22, the input/output 1070, etc. Alternatively, the integrated circuits 1300a to 1300f may be circuits corresponding to the logic blocks in the CPU 20 or the host controller 22.

The thermoelectric conversion module 60F is a module for performing cooling of the integrated circuits 1300a to 1300f and/or power generation utilizing heat generated by the integrated circuits 1300a to 1300f. The thermoelectric conversion module 60F is constructed in such a manner that thermoelectric devices 60F-1 to 60F-6 each having the same construction as the thermoelectric device 60 shown in FIG. 4 are placed on the corresponding integrated circuits 1300a to 1300f. The thermoelectric conversion portions 65 provided in the thermoelectric devices 60F-1 to 60F-6 are provided in different regions defined by dividing the thermoelectric conversion module 60F into a plurality of regions. The heat-receiving portion 62 of the thermoelectric device 60F-1 receives heat generated by the integrated circuit 1300a, and the heat-receiving portion 62 of the thermoelectric device 60F-2 receives heat generated by the integrated circuit 1300b. Similarly, the heat-receiving portions 62 of the thermoelectric device 60F-3 to 60F-6 receive heat generated by the integrated circuits 1300c to 1300f. The operating mode of each of the thermoelectric conversion portions 65 in the thermoelectric conversion devices 60F-1 to 60F-6 can be independently selected from a cooling mode for cooling the corresponding heat-receiving portion 62 and a power generation mode of converting heat received from the heat-receiving portion 62 into a current and outputting the current.

In use of the above-described thermoelectric conversion module 60F, the information processor 10 can independently select the operating mode of each of the thermoelectric devices 60F-1 to 60F-6 according to the amount of heat from the corresponding one of the integrated circuits 1300a to 1300f, which generate different amount of heats depending on operating conditions. Therefore the information processor 10 can suitably select, according to the temperature conditions of the integrated circuits 1300a to 1300f, cooling of the integrated circuits 1300a to 1300f or power generation utilizing heat generated by the integrated circuits 1300a to 1300f.

While the present invention has been described with respect to the embodiment of the invention, the technical scope of the present invention is not limited to the described embodiment. Various changes and modifications may be made in the described embodiment. As is apparent from the description in the appended Claims, modes of the present invention characterized by such changes and modifications are also included in the technical scope of the invention.

For example, not only the cooling device constituted by the thermoelectric conversion module 60A, the thermoelectric conversion module 60B and the cooling control program executed on the information processor 10 but also the thermoelectric conversion module 60A itself, the thermoelectric conversion module 60C, the thermoelectric conversion module 60D, the thermoelectric conversion module 60E, or the thermoelectric conversion module 60F may be regarded as a cooling device in accordance with the present invention.

The cooling device of this embodiment can be applied to electric apparatuses such as refrigerators and air conditioners other than the information processor 10. Further, the cooling device of this embodiment can be applied to transport apparatuses such as motor vehicles and aircraft. For example, the cooling device of this embodiment may be used for cooling of a muffler, power generation using exhaust heat, cooling of an engine, power generation using combustion heat, etc., in motor vehicles or the like.

The cooling device of this embodiment can be cooling of various heat-generating components other than the CPU 20, the host controller 22 and integrated circuits.

A heating device which superheats a cooled component and generates power by utilizing a temperature difference from a cooled component may be realized in the same manner as the cooling device of this embodiment.

In the drawings and specifications there has been set forth a preferred embodiment of the invention and, although specific terms are used, the description thus given uses terminology in a generic and descriptive sense only and not for purposes of limitation.

We claim as our invention:

1. Apparatus comprising:
a module which generates heat;
a heat receiver which receives heat conducted from said module, wherein the heat receiver comprises a heat conducting material forming a cavity for air;
a thermoelectric converter located in the cavity of the heat receiver and arranged to absorb heat from said heat receiver and to reject heat into the cavity and the thermoelectric converter having operating modes including (a) a cooling mode which cools said heat receiver when supplied with a current, and (b) a power generation mode which converts heat received from said heat receiver into a current and outputs the current; and
a selector which on the basis of a temperature condition of said module selects which one of the operating modes said thermoelectric converter operates.

2. Apparatus of claim 1 wherein said thermoelectric converter cools said heat receiver in the cooling mode by utilizing the Peltier effect, and converts heat from said heat receiver into current in the power generation mode by utilizing the Seebeck effect.

3. Apparatus of claim 1 wherein said cavity further comprises a first opening and a second opening wherein the first and second openings are configured to allow air to flow through the cavity to remove heat rejected from the thermoelectric converter.

4. Apparatus of claim 3, further comprising a fan located in said cavity configured to draw air through the first opening and to expel air through the second opening.

5. Apparatus of claim 4, further comprising a sensor which measures the temperature of said module; whereby said selector selects the operating mode of said thermoelectric converter on the basis the temperature as measured by said sensor and said sensor is provided in said module.

6. Apparatus of claim 1 wherein said module is an integrated circuit.

7. Apparatus of claim 1, further comprising a heat pipe in contact with said module at a first end of the heat pipe and a second end of the heat pipe in contact with the thermoelectric converter located in cavity of the heat receiver, wherein the module conducts heat to the thermoelectric converter through the heat pipe.

8. Apparatus comprising:
a first module and a second module each generating heat;
a first heat receiver which receives heat from said first module wherein the first heat receiver comprises a heat conducting material forming a cavity for air;
a second heat receiver which receives heat from said second module;
a first thermoelectric convener located in the cavity of the heat receiver and arranged to absorb heat from said first heat receiver and to reject heat into the cavity and the first thermoelectric converter having operating modes including (a) a cooling mode which cools said first heat receiver when supplied with a current, and (b) a power generation mode which converts heat received from said first heat receiver into a current and outputs the current; and
a second thermoelectric converter arranged to absorb heat from said second heat receiver and having operating modes including (c) a cooling mode which cools said second heat receiver when supplied with a current, and (d) a power generation mode which converts heat received from said second heat receiver into a current and outputs the current;
wherein said first thermoelectric converter operates in the power generating mode (b) while said second thermoelectric converter operates in the cooling mode (c), said second thermoelectric converter uses the current output from said first thermoelectric converter to cool said second heat receiver.

9. Apparatus of claim 8 wherein said first thermoelectric converter cools said first heat receiver in the cooling mode by utilizing the Peltier effect, and converts heat from said first heat receiver into current in the power generation mode by utilizing the Seebeck effect, and said second thermoelectric converter cools said second heat receiver in the cooling mode by utilizing the Peltier effect, and converts heat from said second heat receiver into current in the power generation mode by utilizing the Seebeck effect.

10. Apparatus of claim 8 wherein at least one of said first module and said second module is an integrated circuit.

11. Apparatus of claim 8, wherein said first and second modules are integrated circuits provided on one substrate.

12. Apparatus of claim 8, wherein said cavity further comprises a fan located in said cavity configured to expel heat from the cavity by drawing air through a first opening in said cavity and expelling air through a second opening in said cavity.

13. A cooling method comprising the steps of:
receiving heat through a heat receiver which conducts heat generated by a module, wherein the module comprises an integrated circuit,
rejecting heat to a cavity of the heat receiver, the heat receiver comprising a heat conducting material forming the cavity and the cavity configured for air flow,
selecting on the basis of a temperature condition of the module, an operation mode of a thermoelectric converter arranged to absorb heat from the heat receiver, wherein the operation mode includes (a) a cooling mode which cools the heat receiver when supplied with a current, and (b) a power generation mode which converts heat received from the heat receiver into a current and outputs the current.

14. The method of claim 13 wherein the thermoelectric convener cools the heat receiver in the cooling mode by utilizing the Peltier effect, and converts heat from the heat receiver into current in the power generation mode by utilizing the Seebeck effect.

15. The method of claim 13, further comprising rejecting heat from the cavity by drawing air though a first opening in the heat receiver and expelling air from a second opening in the heat receiver.

16. A cooling method comprising the steps of:

receiving heat through a first heat receiver which conducts heat generated by a first module, wherein the first heat receiver comprises a heat conducting material forming a cavity for air;

receiving heat through a second heat receiver which conducts heat generated by a second module;

wherein (i) a first thermoelectric converter is located in the cavity of the heat receiver and is arranged to absorb heat from the first heat receiver and to reject heat into the cavity and the first thermoelectric converter having operation modes including (a) a cooling mode which cools the first heat receiver when supplied with a current and (b) a power generation mode which converts heat received from the first heat receiver into a current and outputs the current, setting the first thermoelectric device to operate in the power generation mode; and wherein (ii) a second thermoelectric converter is arranged to absorb heat from the second heat receiver and having operation modes including (a) a cooling mode which cools the second heat receiver when supplied with a current and (b) a power generation mode which converts heat received from the second heat receiver into a current and outputs the current, and selling the second thermoelectric device to operate in the cooling mode and utilizing the current output from the first thermoelectric conversion part as input to the second thermoelectric conversion part.

17. The method of claim 16 wherein the first thermoelectric converter cools the first heat receiver in the cooling mode by utilizing the Peltier effect, and converts heat from the first heat receiver into current in the power generation mode by utilizing the Seebeck effect, and the second thermoelectric converter cools the second heat receiver in the cooling mode by utilizing the Peltier effect, and converts heat from the second heat receiver into current in the power generation mode by utilizing the Seebeck effect.

18. The method of claim 16 wherein at least one of the first module and the second module is an integrated circuit.

19. The method of claim 16, wherein said cavity further comprises a fan located in said cavity configured to expel heat from the cavity by drawing air through a first opening in said cavity and expelling air through a second opening in said cavity.

20. The method of claim 19, wherein the second receiver comprises a heat pipe configured to conduct heat from said second module to said cavity.

* * * * *